United States Patent
Tanaka et al.

(10) Patent No.: US 9,653,354 B2
(45) Date of Patent: May 16, 2017

(54) METAL WIRING LAYER FORMING METHOD, METAL WIRING LAYER FORMING APPARATUS, AND RECORDING MEDIUM

(71) Applicant: Tokyo Electron Limited, Tokyo (JP)

(72) Inventors: Takashi Tanaka, Nirasaki (JP); Nobutaka Mizutani, Nirasaki (JP); Mitsuaki Iwashita, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/029,655

(22) PCT Filed: Oct. 14, 2014

(86) PCT No.: PCT/JP2014/077355
§ 371 (c)(1),
(2) Date: Apr. 15, 2016

(87) PCT Pub. No.: WO2015/056678
PCT Pub. Date: Apr. 23, 2015

(65) Prior Publication Data
US 2016/0240436 A1 Aug. 18, 2016

(30) Foreign Application Priority Data
Oct. 17, 2013 (JP) .................. 2013-216745

(51) Int. Cl.
| | |
|---|---|
| H01L 21/4763 | (2006.01) |
| H01L 21/768 | (2006.01) |
| C23C 18/32 | (2006.01) |
| H01L 21/288 | (2006.01) |
| H01L 23/532 | (2006.01) |
| C23C 18/18 | (2006.01) |

(Continued)

(52) U.S. Cl.
CPC .... *H01L 21/76879* (2013.01); *C23C 18/1633* (2013.01); *C23C 18/1844* (2013.01); *C23C 18/31* (2013.01); *C23C 18/32* (2013.01); *H01L 21/288* (2013.01); *H01L 21/7685* (2013.01); *H01L 21/76814* (2013.01); *H01L 21/76864* (2013.01); *H01L 21/76874* (2013.01); *H01L 23/53257* (2013.01); *H01L 23/53295* (2013.01); *H01L 2924/0002* (2013.01)

(58) Field of Classification Search
CPC .................................................. H01L 21/4763
See application file for complete search history.

(56) References Cited

FOREIGN PATENT DOCUMENTS

| | | |
|---|---|---|
| JP | 63-104350 A | 5/1988 |
| JP | 08-83796 A | 3/1996 |

(Continued)

OTHER PUBLICATIONS

International Search Report for PCT/JP2014/077355 dated Jan. 20, 2015.

*Primary Examiner* — Marvin Payen
(74) *Attorney, Agent, or Firm* — Pearne & Gordon LLP

(57) ABSTRACT

A metal wiring layer can be formed within a recess of a substrate while suppressing the metal wiring layer from being formed at the outside of the recess. A metal wiring layer forming method includes forming a catalyst layer 5 formed of Pd on a tungsten layer W on a bottom surface 3a of the recess 3 of the substrate 2 without forming the catalyst layer 5 on a surface 3b of an insulating layer of the recess 3; and forming a Ni-based metal wiring layer 7 on the catalyst layer 5 of the recess 3.

16 Claims, 6 Drawing Sheets

(51) Int. Cl.
*C23C 18/16* (2006.01)
*C23C 18/31* (2006.01)

(56) References Cited

FOREIGN PATENT DOCUMENTS

| | | |
|---|---|---|
| JP | 2002-110784 A | 4/2002 |
| JP | 2004-193298 A | 7/2004 |
| JP | 2008-053568 A | 3/2008 |
| JP | 2010-185113 A | 8/2010 |

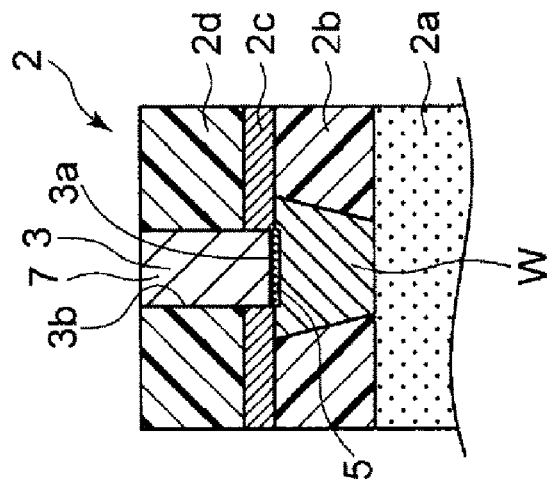
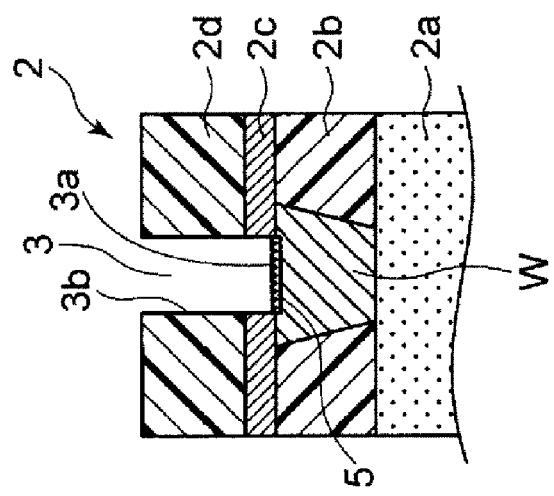
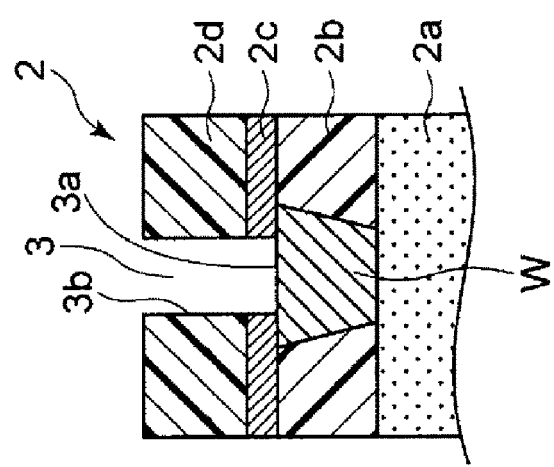

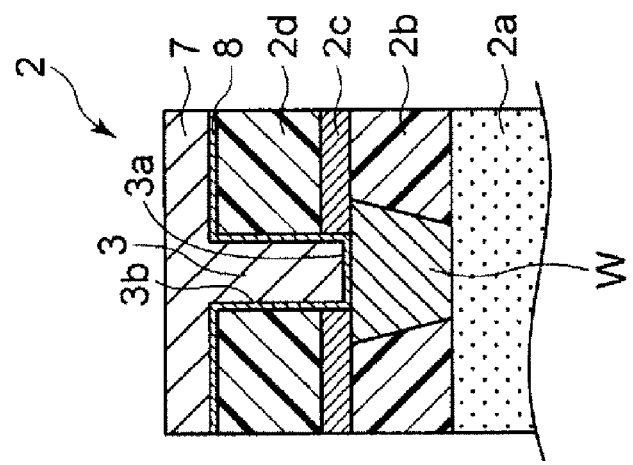
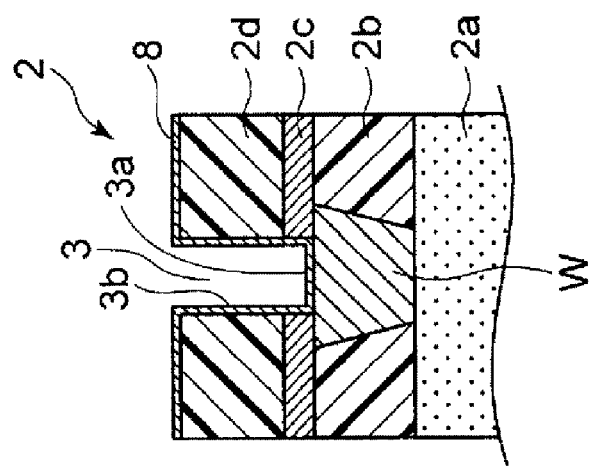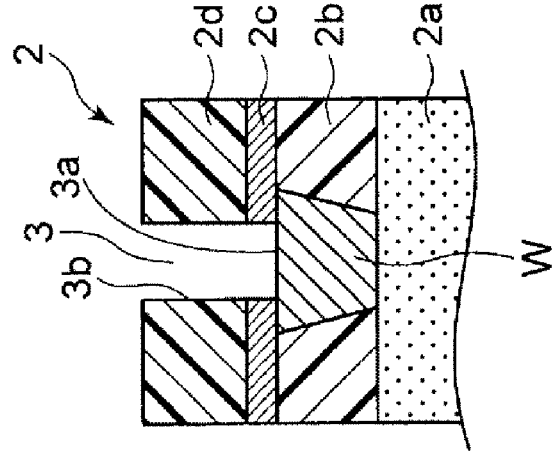

METAL WIRING LAYER FORMING METHOD, METAL WIRING LAYER FORMING APPARATUS, AND RECORDING MEDIUM

CROSS-REFERENCE TO RELATED APPLICATION

This application claims the benefit of Japanese Patent Application No. 2013-216745 filed on Oct. 17, 2013, the entire disclosures of which are incorporated herein by reference.

TECHNICAL FIELD

The various embodiments described herein pertain generally to a metal wiring layer forming method and a metal wiring layer forming apparatus for forming a metal wiring layer on a substrate, and a recording medium therefor.

BACKGROUND ART

Recently, semiconductor devices such as a LSI or the like have been required to have higher density in order to meet requirements for reducing the mounting space or for improving the processing rate. As an example of a technology that achieves the higher density, there has been known a multilayer wiring technology of manufacturing a multilayer substrate, such as a three-dimensional LSI or the like, by stacking multiple wiring substrates.

According to the multilayer wiring technology, a through-via-hole in which a conductive material such as copper (Cu) is buried is typically formed to penetrate each wiring substrate in order to obtain electrical connection between the wiring substrates.

When preparing the wiring substrate, Cu is used as a conductive material and is buried in a recess of the substrate. For this purpose, a barrier layer as a Cu diffusion barrier film needs to be formed within the recess, and a seed film needs to be formed on the barrier film by electroless Cu plating. Accordingly, a wiring volume of a wiring layer may be reduced or a void may be formed in the buried Cu. Meanwhile, there has been also proposed a method of burying, instead of Cu, a Ni-based metal within the recess of the substrate by an electroless plating and using the Ni-based metal as the wiring layer.

When burying the Ni-based metal within the recess of the substrate, however, the Ni-based metal layer may be formed at the outside of the recess as well. In such a case, the portion of the Ni-based metal layer formed the outside of the recess needs to be removed later by using a chemical mechanical polishing process.

Patent Document 1: Japanese Patent Laid-open Publication No. 2010-185113

DISCLOSURE OF THE INVENTION

Problems to be Solved by the Invention

In view of the foregoing, exemplary embodiments provide a metal wiring layer forming method, a metal wiring layer forming apparatus and a recording medium, capable of forming a metal wiring layer within a recess of a substrate easily and simply through a plating process while suppressing the metal wiring layer from being formed at the outside of the recess.

Means for Solving the Problems

In one exemplary embodiment, a metal wiring layer forming method of forming a metal wiring layer on a substrate includes preparing a substrate, having a recess including an insulating layer, in which a tungsten layer is formed on a bottom surface of the recess; forming a catalyst layer on the tungsten layer on the bottom surface of the recess without forming the catalyst layer on a surface of the insulating layer of the recess; and forming a metal wiring layer on the catalyst layer within the recess by a plating process.

In another exemplary embodiment, a metal wiring layer forming method of forming a metal wiring layer on a substrate includes preparing a substrate, having a recess including an insulating layer, in which a tungsten layer is formed on a bottom surface of the recess; creating, by supplying a silylating agent into the recess, a state in which a coupling agent is attached to the tungsten layer on the bottom surface of the recess without being attached to a surface of the insulating layer of the recess; forming, by supplying the coupling agent into the recess, an adhesion layer on the tungsten layer on the bottom surface of the recess without forming the adhesion layer on the surface of the insulating layer of the recess; forming a catalyst layer on the tungsten layer on the bottom surface of the recess without forming the catalyst layer on the surface of the insulating layer of the recess; and forming a metal wiring layer on the catalyst layer within the recess by a plating process.

In yet another exemplary embodiment, a metal wiring layer forming apparatus of forming a metal wiring layer on a substrate includes a catalyst layer forming unit configured to form, with respect to a substrate, having a recess including an insulating layer, in which a tungsten layer is formed on a bottom surface of the recess, a catalyst layer on the tungsten layer on the bottom surface of the recess of the substrate, without forming the catalyst layer on a surface of the insulating layer of the recess; and a metal wiring layer forming unit configured to form a metal wiring layer on the catalyst layer within the recess by a plating process.

In still another exemplary embodiment, a metal wiring layer forming apparatus of forming a metal wiring layer on a substrate includes a silylating agent supplying unit configured to create, with respect to the a substrate, having a recess including a side surface and a bottom surface, in which a tungsten layer is formed on the bottom surface of the recess, a state in which a coupling agent is attached to the tungsten layer at the bottom surface of the recess without being attached to the side surface of the recess, by supplying a silylating agent into the recess; an adhesion layer forming unit configured to form, by supplying the coupling agent into the recess, an adhesion layer on the tungsten layer on the bottom surface of the recess without forming the adhesion layer on the side surface of the recess; a catalyst layer forming unit configured to form a catalyst layer on the tungsten layer on the bottom surface of the recess without forming the catalyst layer on the side surface of the recess; and a metal wiring layer forming unit configured to form a metal wiring layer on the catalyst layer within the recess by a plating process.

In still another exemplary embodiment, there is provided a non-transitory computer-readable recording medium having stored thereon computer-executable instructions that, in response to execution, cause one or more processors to perform a metal wiring layer forming method. Here, the metal wiring layer forming method includes preparing a substrate, having a recess including a side surface and a bottom surface, in which a tungsten layer is formed on the bottom surface of the recess; forming a catalyst layer on the tungsten layer on the bottom surface of the recess without forming the catalyst layer on the side surface of the recess; and forming a metal wiring layer on the catalyst layer within the recess by a plating process.

In still another exemplary embodiment, there is provided a computer-readable recording medium having stored thereon computer-executable instructions that, in response to execution, cause one or more processors to perform a metal wiring layer forming method. Here, the metal wiring layer forming method includes preparing a substrate, having a recess including a side surface and a bottom surface, in which a tungsten layer is formed on the bottom surface of the recess; creating, by supplying a silylating agent into the recess, a state in which a coupling agent is attached to the tungsten layer on the bottom surface of the recess without being attached to the side surface of the recess; forming, by supplying a coupling agent into the recess, an adhesion layer on the tungsten layer on the bottom surface of the recess without forming the adhesion layer on the side surface of the recess; forming a catalyst layer on the tungsten layer on the bottom surface of the recess without forming the catalyst layer on the side surface of the recess; and forming a metal wiring layer on the catalyst layer within the recess by a plating process.

Effect of the Invention

According to the exemplary embodiments, it is possible to form a metal wiring layer within a recess of a substrate easily and simply without forming the metal wiring layer at the outside of the recess.

BRIEF DESCRIPTION OF THE DRAWINGS

FIG. 2A to FIG. 2C are schematic diagrams illustrating the metal wiring layer forming method according to the first exemplary embodiment.

FIG. 8A to FIG. 8C are schematic diagrams illustrating the metal wiring layer forming method as the comparative example.

DETAILED DESCRIPTION

First Exemplary Embodiment

Figure 1:
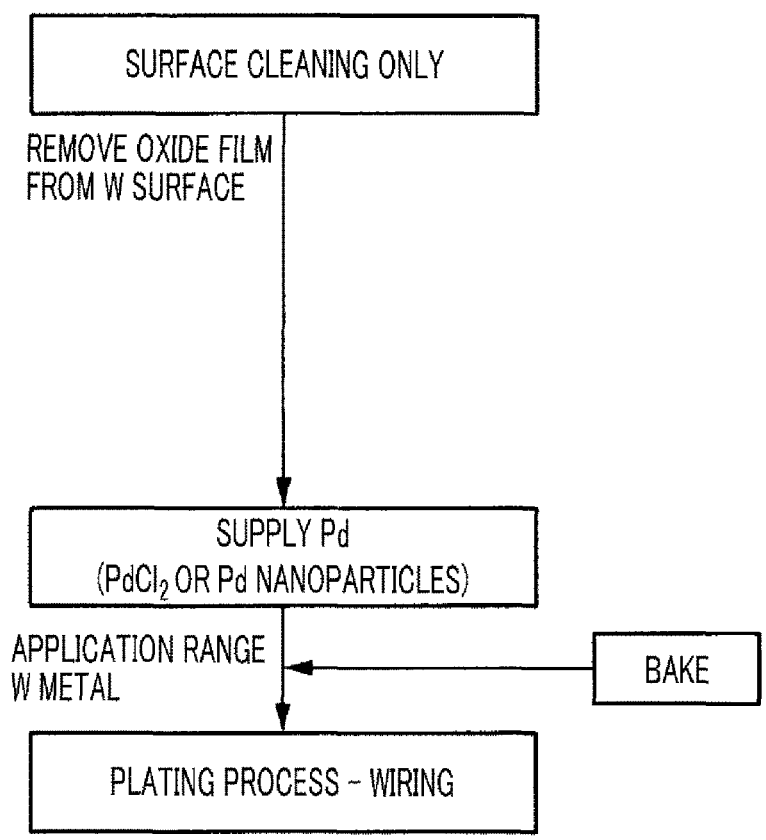
FIG. 1 is a flowchart for describing a metal wiring layer forming method according to a first exemplary embodiment.

Hereinafter, a first exemplary embodiment will be described with reference to FIG. 1 to FIG. 4.

A metal wiring layer forming method according the present exemplary embodiment is directed to forming a metal wiring layer on a silicon substrate (hereinafter, simply referred to as "substrate") 2 having a recess 3, as illustrated in FIG. 2A to FIG. 2C. For example, the substrate 2 may be implemented by, but not limited to, a semiconductor wafer.

As depicted in FIG. 2A to FIG. 2C, the substrate 2 is provided with the recess 3 having a bottom surface 3a and a side surface 3b.

To elaborate, the substrate 2 has a substrate base 2a made of Si; a TEOS layer 2b formed on the substrate base 2a; a SiN layer 2c formed on the TEOS layer 2b; and a TEOS layer 2d formed on the SiN layer 2c. The TEOS layer 2b has a through hole, and a tungsten layer W is buried in the through hole (see FIG. 2A).

Further, each of the TEOS layer 2b, the SiN layer 2c and the TEOS layer 2d is formed as an insulating layer.

The substrate 2 having the above-described structure can be prepared by a commonly known method in the pertinent art. For example, the substrate 2 may be obtained by a method described in FIG. 3A to FIG. 3E.

Figure 3A:
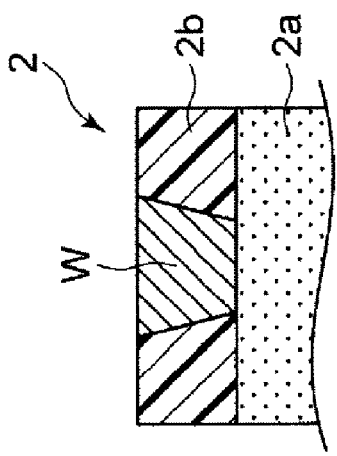
FIG. 3A to FIG. 3E are diagrams illustrating a substrate on which the metal wiring layer forming method according to the first exemplary embodiment is performed.
Figure 3B:
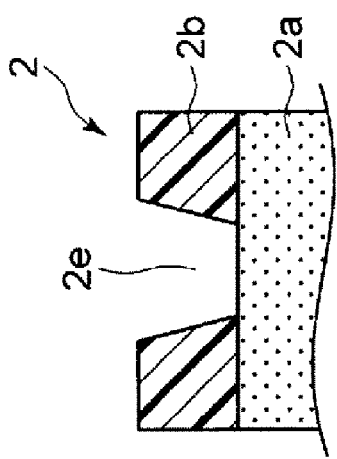

First, a substrate 2 having a substrate base 2a made of Si is prepared (see FIG. 3A). Then, a TEOS layer 2b is formed on the substrate base 2a of the silicon substrate 2 by CVD, and a through hole 2e is formed in the TEOS layer 2b by etching (see FIG. 3B).

Figure 3C:
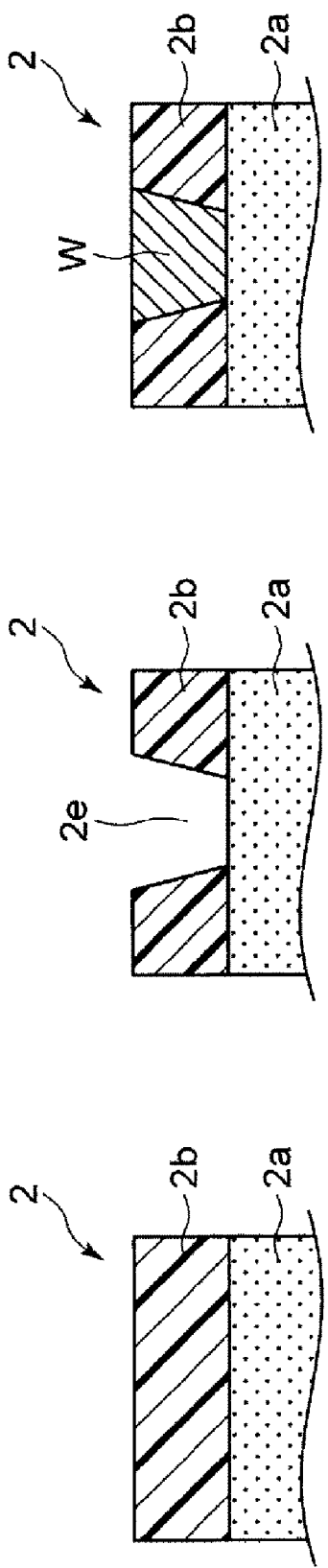

Then, as depicted in FIG. 3C, a tungsten layer W is buried in the through hole 2e of the TEOS layer 2b by CVD.

Figure 3D:
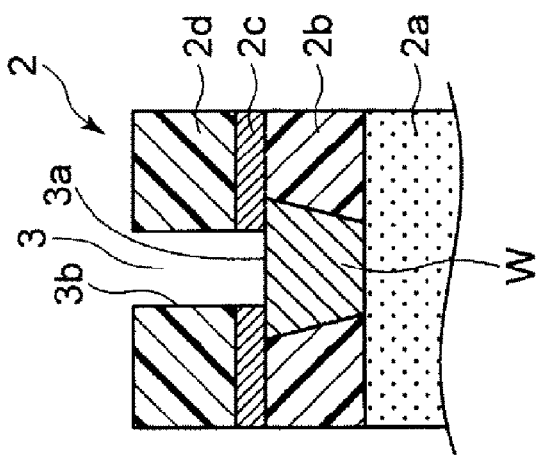

Subsequently, as shown in FIG. 3D, a SiN layer 2c and a TEOS layer 2d are formed on the TEOS layer 2b and the tungsten layer W in sequence by CVD.

Figure 3E:
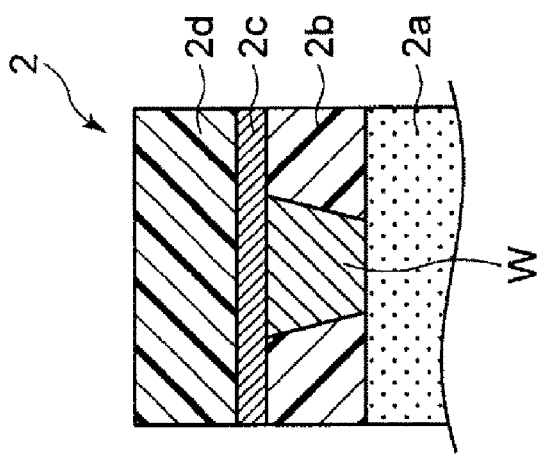

Thereafter, the SiN layer 2c and the TEOS layer 2d on the tungsten layer W are removed by etching, so that the substrate 2 is provided with a recess 3 which has an insulating layer and a bottom surface 3a (see FIG. 3E).

In FIG. 3E, the recess 3 is formed in the substrate 2, and the tungsten layer W is formed on the bottom surface of the recess 3.

Figure 4:
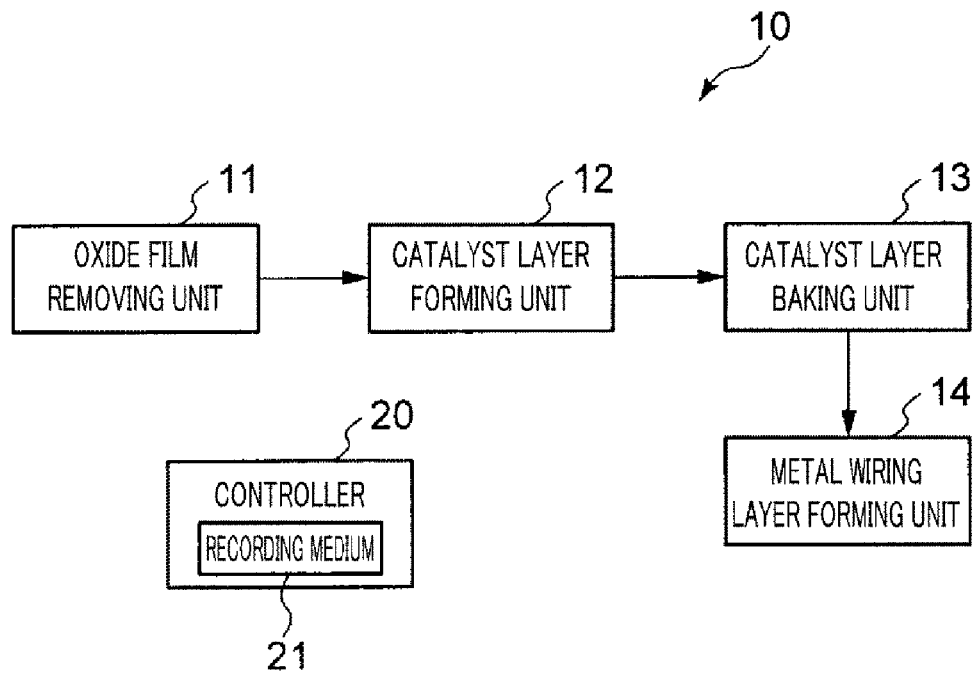
FIG. 4 is a block diagram illustrating a metal wiring layer forming apparatus according to the first exemplary embodiment.

Now, a metal wiring layer forming apparatus 10 configured to form a metal wiring layer on the substrate 2 having the above-described recess 3 will be explained with reference to FIG. 4.

The metal wiring layer forming apparatus 10 includes an oxide film removing unit 11 configured to remove an oxide film on a surface of the tungsten layer W at the bottom surface 3a of the recess 3 of the substrate 2; a catalyst layer forming unit 12 provided at the back of the oxide film removing unit 11 and configured to form a catalyst layer 5 (see FIG. 2A to FIG. 2C) on the tungsten layer W at the bottom surface 3a of the recess 3 without forming the catalyst layer 5 on the surface 3b of the insulating layer of the recess 3; a catalyst layer baking unit 13 provided at the back of the catalyst layer forming unit 12 and configured to bake and harden the catalyst layer 5. Further, a metal wiring layer forming unit 14 configured to form a metal wiring layer 7 on the catalyst layer 5 within the recess 3 by a plating process is provided at the back of the catalyst layer baking unit 13.

The individual components of the above-described metal wiring layer forming apparatus 10, for example, the oxide film removing unit 11, the catalyst layer forming unit 12, the catalyst layer baking unit 13 and the metal wiring layer forming unit 14 are controlled by a controller 20 according to various kinds of programs recorded on a recording medium 21 provided in the controller 20, so that various processes are performed on the substrate 2. Here, the recording medium 21 stores thereon various kinds of setup data or various kinds of programs such as a metal wiring layer forming program to be described later. The recording medium 21 may be implemented by, but not limited to, a computer-readable memory such as a ROM or a RAM, or a disk type recording medium such as a hard disk, a CD-ROM, a DVD-ROM or a flexible disk, as commonly known in the art.

Now, an operation of the first exemplary embodiment having the above-described configuration will be described with reference to FIG. 1 to FIG. 3E.

As stated above, in the pre-processes shown in FIG. 3A to FIG. 3E, the recess 3 is formed on the substrate (silicon substrate) 2 implemented by a semiconductor wafer or the like, and the substrate 2 having the recess 3 is transferred into the metal wiring layer forming apparatus 10 according to the present exemplary embodiment. The substrate 2 includes the substrate base 2a made of Si, the TEOS layer 2b, the SiN layer 2c and the TEOS layer 2d, and the substrate 2 is also provided with the recess 3 having the bottom surface 3a and the insulating layer.

Further, the tungsten layer W is formed on the bottom surface 3a of the recess 3 of the substrate 2 (see FIG. 2A).

Here, as a method of forming the recess 3 on the substrate 2, a commonly known method in the art may be appropriately employed. Specifically, as a dry etching technique, for example, a general-purpose technique using a fluorine-based gas or a chlorine-based gas may be employed. Especially, in order to form a hole having a high aspect ratio (hole depth/hole diameter), a method using an ICP-RIE (Inductively Coupled Plasma Reactive Ion Etching) technique, which can perform a deep etching process with a high speed, may be more appropriately adopted. Especially, a Bosch process in which an etching process using sulfur hexafluoride ($SF_6$) and a protection process using a TEFLON (registered trademark)-based gas such as $C_4F_8$ are repeatedly performed may be appropriately utilized.

Then, within the metal wiring layer forming apparatus 10, the substrate 2 having the recess 3 formed thereon is sent into the oxide film removing unit 11, as shown in FIG. 1. In the oxide film removing unit 11, an oxide film on the surface of the tungsten layer W formed on the bottom surface 3a of the recess 3 is removed by a cleaning process with a DHF solution.

Thereafter, the substrate 2 is transferred into the catalyst layer forming unit 12. In the catalyst layer forming unit 12, the catalyst layer 5 is formed only on the surface of the tungsten layer W formed on the bottom surface 3a of the recess 3, without being formed on the surface 3b of the insulating layer of the recess 3 (see FIG. 2B).

As stated above, in the oxide film removing unit 11 provided at the front of the catalyst layer forming unit 12, the oxide film on the surface of the tungsten layer W formed on the bottom surface 3a of the recess 3 of the substrate 2 is removed by the cleaning process with the DHF solution. In this case, an adhesion layer forming process configured to form an adhesion layer within the recess 3 and at a periphery portion of the recess 3 by supplying a coupling agent is not performed on the substrate 2 to be transferred from the oxide film removing unit 11 into the catalyst layer forming unit 12. Meanwhile, in the oxide film removing unit 11, the oxide film on the tungsten layer W formed on the bottom surface 3a of the recess 3 is removed.

As mentioned above, since the surface 3b of the insulating layer of the recess 3 is formed of the SiN layer 2c and the TEOS layer 2d, the catalyst layer 5 is not formed on the surface 3b of the insulating layer of the recess 3 in the catalyst layer forming unit 12 as long as an adhesion layer is not formed thereon. Thus, the catalyst layer is formed only on the surface of the tungsten layer W from which the oxide film has been removed.

Below, the catalyst layer forming process performed in the catalyst layer forming unit 12 will be further discussed.

As depicted in FIG. 2B, in the catalyst layer forming process, there may be employed a method of adsorbing Pd ions serving as a catalyst onto the surface of the substrate 2 by supplying a palladium chloride solution onto the substrate 2 from a nozzle. To be elaborate, by discharging a tin chloride solution onto the substrate 2, tin ions are adsorbed onto the surface of the substrate 2; by supplying the palladium chloride solution onto the substrate 2, the tin ions are substituted with Pd ions and the Pd ions are adsorbed onto the surface of the substrate 2; and by supplying sodium hydroxide onto the substrate 2, residues of the tin ions are removed. Through this process, the catalyst layer 5 can be formed only on the tungsten layer W formed on the bottom surface 3a of the recess 3 of the substrate 2.

Alternatively, to form the catalyst layer 5 on the tungsten layer W of the recess 3 of the substrate 2, a catalyst solution including a catalyst having catalysis to accelerate a plating reaction, for example, a catalyst formed of a nanoparticle may be used. Here, the nanoparticle refers to a particle having catalysis and having an average particle diameter in the range from, e.g., 0.5 nm to 20 nm. An element constituting the nanoparticle may include, but not limited to, palladium, gold, platinum, or the like.

Further, ruthenium may also be used as the element constituting the nanoparticle.

A method of measuring the average particle diameter of the nanoparticles is not particularly limited, and various methods may be adopted. By way of example, when measuring the average particle diameter of the nanoparticles in the catalyst solution, a dynamic light scattering method may be employed. In the dynamic light scattering method, a laser beam is irradiated to the nanoparticles dispersed in the catalyst solution, and the average particle diameter of the nanoparticles is calculated by measuring scattered light. Further, to measure the average particle diameter of the nanoparticles adsorbed on the recess 3 of the substrate 2, a preset number of nanoparticles, for example, twenty nanoparticles may be detected from an image which is obtained by using a TEM or a SEM, and the average particle diameter of these nanoparticles may be calculated.

Now, the catalyst solution containing the catalyst formed of the nanoparticle will be elaborated. The catalyst solution contains ions of a metal constituting the nanoparticle serving as the catalyst. For example, if palladium constitutes the nanoparticle, the catalyst solution contains a palladium compound, such as palladium chloride, as a palladium ion source.

A specific composition of the catalyst solution is not particularly limited. Desirably, however, the composition of the catalyst solution is set such that the catalyst solution has a viscosity coefficient equal to or less than 0.01 Pa·s. By setting the viscosity coefficient of the catalyst solution to be in this range, the catalyst solution can be sufficiently diffused down up to the bottom surface 3a of the recess 3 of the substrate 2, even if a diameter of the recess 3 of the substrate 2 is small. Accordingly, the catalyst can be adsorbed to the bottom surface 3a of the recess 3 of the substrate 2 as well more securely.

Desirably, the catalyst in the catalyst solution is coated with a dispersant. Accordingly, surface energy of the catalyst can be reduced. As a result, it is assumed that the diffusion of the catalyst within the catalyst solution can be more accelerated, so that the catalyst can reach the bottom surface 3a of the recess 3 of the substrate 2 in a shorter time period. Furthermore, it is assumed that an increase in the diameter of the catalyst that might be caused by agglomeration of multiple catalysts can be suppressed, so that the diffusion of the catalyst in the catalyst solution can be further accelerated.

A method for preparing the catalyst coated with the dispersant is not particularly limited. By way of example, a catalyst solution containing the catalyst which is previously coated with the dispersant may be used.

Specifically, it is desirable to use polyvinylpyrrolidone (PVP), polyacrylic acid (PAA), polyethyleneimine (PEI), tetramethylammonium (TMA), citric acid, or the like as the dispersant.

Besides, various chemical materials for controlling the characteristic may be added into the catalyst solution.

As described above, in the catalyst layer forming unit 12, the catalyst layer 5 is formed only on the surface of the tungsten layer W which is formed on the bottom surface 3a of the recess 3.

The substrate 2 having the catalyst layer 5 formed on the surface of the tungsten layer W is then sent into the catalyst layer baking unit 13, and the substrate 2 is heated within the catalyst layer baking unit 13. Accordingly, the catalyst layer 5 on the surface of the tungsten layer W formed on the bottom surface 3a of the recess 3 is baked and hardened.

In case that the catalyst layer 5 is formed of metal nanoparticles, it is possible to harden the catalyst layer 5 more effectively by baking the catalyst layer 5.

Subsequently, the substrate 2 is sent from the catalyst layer baking unit 13 into the metal wiring layer forming unit 14. In this metal wiring layer forming unit 14, a plating process is performed by supplying, for example, an electroless NiB plating liquid into the recess 3 of the substrate 2, so that a metal wiring layer 7 made of an electroless NiB plating layer is formed on the catalyst layer 5 on the tungsten layer W.

In the present exemplary embodiment, the metal wiring layer 7 formed on the catalyst layer 5 may be made of, by way of non-limiting example, Ni, NiB, NiP, Co, CoB, CoP, or the like.

According to the first exemplary embodiment as described above, the catalyst layer 5 is formed only on the surface of the tungsten layer W which is formed on the bottom surface 3a of the recess 3 of the substrate 2, and this catalyst layer 5 is not formed on the surface 3b of the insulating layer of the recess 3. Therefore, it is possible to form the metal wiring layer 7 only within the recess 3. In this case, since the metal wiring layer 7 is not formed at the outside of the recess 3, a chemical mechanical polishing process for removing the metal wiring layer 7 formed at the outside of the recess 3 need not be performed.

Now, a metal wiring layer forming method as a comparative example will be explained with reference to FIG. 7 and FIG. 8A to FIG. 8C.

In the comparative example shown in FIG. 7 and FIG. 8A to FIG. 8C, first, the substrate 2 provided with the recess 3 having the bottom surface 3a is prepared (see FIG. 8A). Here, the tungsten layer W is provided on the bottom surface 3a of the recess 3.

Then, a hydroxylation process including a plasma process is performed on the substrate 2, and the bottom surface 3a and the surface 3b of the insulating layer of the recess 3 are hydroxylated.

Subsequently, a silane coupling agent is supplied to the bottom surface 3a (tungsten layer W) of the recess 3 and the surface 3b of the insulating layer of the recess 3 of the substrate 2. As a result, an adhesion layer is formed on the bottom surface 3a and the surface 3b of the insulating layer of the recess 3, and a catalyst layer formed of Pd is formed on this adhesion layer later (see FIG. 8B). In FIG. 8B, a reference numeral 8 indicates the adhesion layer and the catalyst layer on the substrate 2.

Thereafter, as depicted in FIG. 8C, the plating process is performed on the substrate 2, so that the metal wiring layer 7 made of, by way of non-limiting example, the electroless NiB plating layer is formed within the recess 3. In the comparative example shown in FIG. 8C, since the adhesion/catalyst layers 8 are formed on the bottom surface 3a and the surface 3b of the insulating layer of the recess 3 of the substrate 2, the metal wiring layer 7 is formed at the outside of the recess 3 as well.

Therefore, in FIG. 8C, a portion of the metal wiring layer 7 that is formed at the outside of the recess 3 of the substrate 2 needs to be removed by the chemical mechanical polishing.

On the contrary, according to the first exemplary embodiment, since the catalyst layer 5 is formed only on the surface of the tungsten layer W which is formed on the bottom surface of the recess 3 of the substrate 2, the metal wiring layer 7, which is formed on the catalyst layer 5, can only be formed within the recess 3. Thus, it is possible to omit the process in which the portion of the metal wiring layer 7 formed at the outside of the recess 3 is removed by the chemical mechanical polishing after the metal wiring layer 7 is formed within the recess 3.

As a result, the metal wiring layer forming process can be simplified with higher efficiency.

Second Exemplary Embodiment

Now, a second exemplary embodiment will be described with reference to FIG. 5 and FIG. 6.

Figure 5:
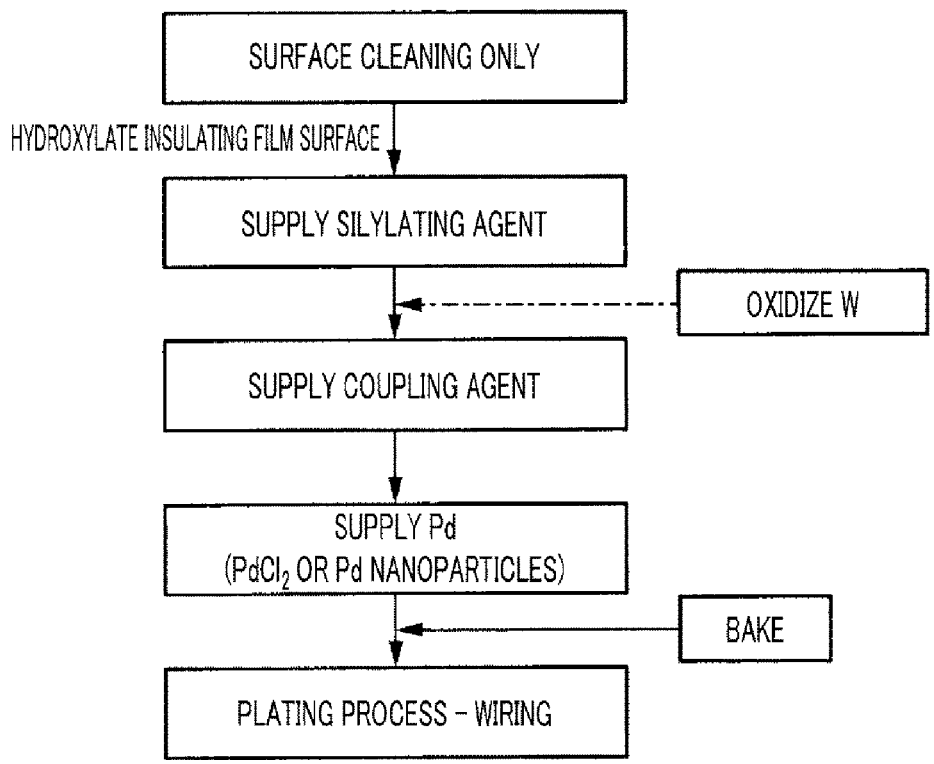
FIG. 5 is a flowchart for describing a metal wiring layer forming method according to a second exemplary embodiment.
Figure 6:
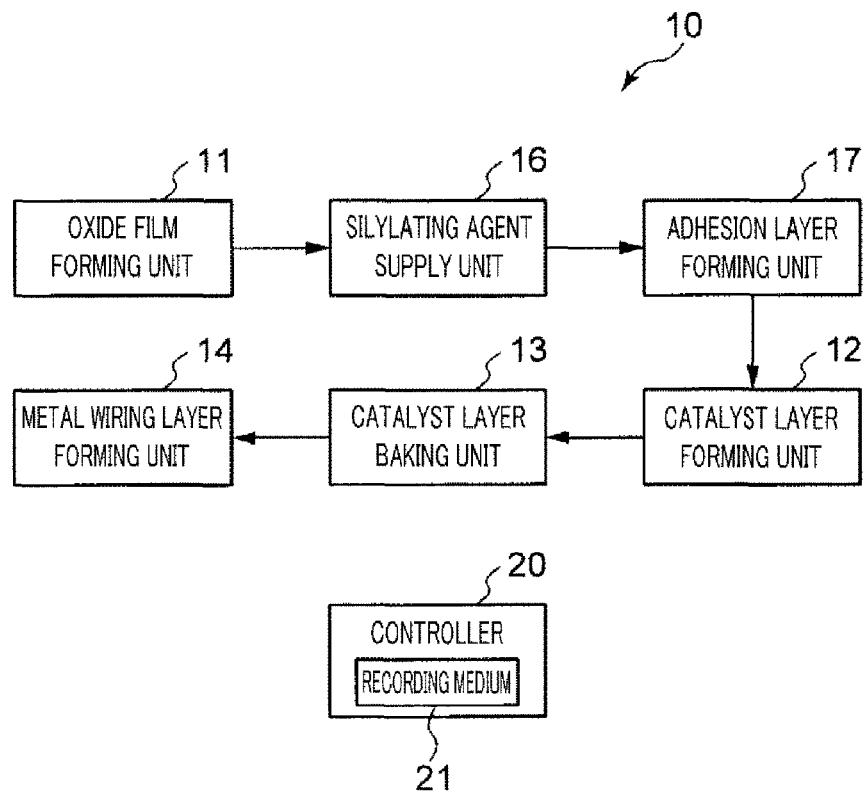
FIG. 6 is a block diagram illustrating a metal wiring layer forming apparatus according to the second exemplary embodiment.
Figure 7:
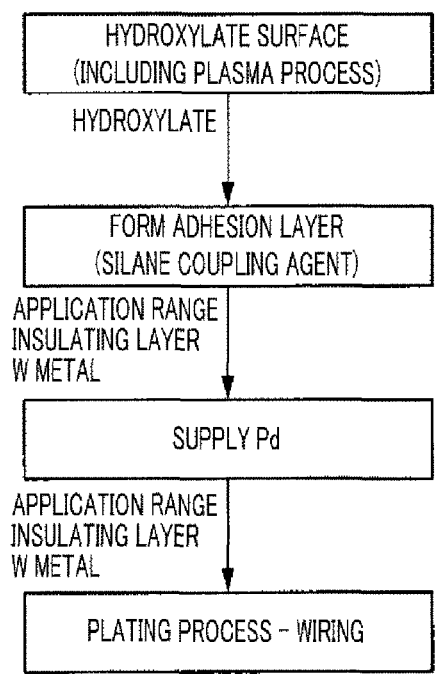
FIG. 7 is a flowchart for describing a metal wiring layer forming method as a comparative example.

A configuration of a metal wiring layer forming apparatus 10 according to the second exemplary embodiment shown in FIG. 5 and FIG. 6 is substantially the same as the configuration of the first exemplary embodiment shown in FIG. 1 to FIG. 4 except that a silylating agent supplying unit 16 and an adhesion layer forming unit 17 are provided between the oxide film removing unit 11 configured to remove the oxide film on the tungsten layer W and the catalyst layer forming unit 12 configured to form the catalyst layer 5.

In the second exemplary embodiment depicted in FIG. 5 and FIG. 6, the same parts as those described in the first exemplary embodiment shown in FIG. 1 to FIG. 4 will be assigned same reference numerals, and detailed description thereof will be omitted.

In the second exemplary embodiment shown in FIG. 5 and FIG. 6, the silylating agent supplying unit 16 supplies a silylating agent into the recess 3 of the substrate 2 to create a state in which a coupling agent does not adhere to the surface 3b of the insulating layer of the recess 3 but only adheres to the surface of the tungsten layer W formed on the bottom surface 3a of the recess 3, as will be described later. Further, the adhesion layer forming unit 17 is configured to form the adhesion layer only on the bottom surface 3a (tungsten layer W), not on the surface 3b of the insulating layer of the recess 3, by supplying the coupling agent into the recess 3 of the substrate 2.

Now, an operation of the second exemplary embodiment having the above-described configuration will be explained. In the metal wiring layer forming apparatus 10, as shown in FIG. 5, the substrate 2 (see FIG. 2A) having the recess 3 is sent into the oxide film removing unit 11. In the oxide film removing unit 11, the oxide film on the surface of the tungsten layer W, which is formed at the bottom surface 3a of the recess 3, is removed by the cleaning process with the DHF solution. Concurrently, the surface 3b of the insulating layer of the recess 3 is hydroxylated.

Subsequently, the substrate 2 is sent into the silylating agent supplying unit 16. In the silylating agent supplying unit 16, the silylating agent is supplied onto the substrate 2. By way of example, but not limitation, TMSDMA or the like may be used as the silylating agent.

By supplying the silylating agent onto the substrate 2 as stated above, a hydroxyl group is removed from the surface 3b of the insulating layer of the recess 3, and the surface 3b of the insulating layer may be turned into a state where the silane coupling agent hardly adheres thereto.

At this time, however, the hydroxyl group remains on the tungsten layer W formed on the bottom surface 3a of the recess 3, and the surface of the tungsten layer W is maintained in a state where the silane coupling agent easily adheres thereto.

Subsequently, the substrate 2 is sent into the adhesion layer forming unit 17. In the adhesion layer forming unit 17, the coupling agent such as the silane coupling agent is supplied onto the substrate 2. At this time, since the hydroxyl group is removed from the surface 3b of the insulating layer of the recess 3, it is difficult for the silane coupling agent to adhere to the surface 3b of the insulating layer of the recess 3. Meanwhile, since the tungsten layer W formed on the bottom surface 3a of the recess 3 is maintained in the state where the silane coupling agent is allowed to adhere thereto, the silane coupling agent adheres only to the tungsten layer W formed on the bottom surface 3a of the recess 3.

Further, before the substrate 2 on which the silylating agent is supplied in the silylating agent supplying unit 16 is sent to the adhesion layer forming unit 17, the tungsten layer W may be heated by heating the substrate 2. Through this heating process, the silane coupling agent can adhere to the tungsten layer W more effectively in the adhesion layer forming unit 17.

Now, an operation in the adhesion layer forming unit 17 will be further elaborated.

The adhesion layer forming unit 17 has a decompression chamber (not shown) equipped with a heating unit. Within the adhesion layer forming unit 17, the coupling agent such as the silane coupling agent is adsorbed onto the substrate 2 having the recess 3, so that an adhesion layer is formed on the tungsten layer W which is formed on the bottom surface 3a of the recess 3 (SAM process). The adhesion layer formed by adsorbing the silane coupling agent improves adhesivity between the tungsten layer W and the catalyst layer 5 to be described below.

The substrate 2 on which the adhesion layer is formed in the adhesion layer forming unit 17 is then transferred into the catalyst layer forming unit 12. In the catalyst layer forming unit 12, Pd ions serving as a catalyst, for example, are adsorbed onto the adhesion layer of the substrate 2 to form the catalyst layer 5 (see FIG. 2B).

Here, since the adhesion layer of the substrate 2 is formed only on the tungsten layer W formed on the bottom surface 3a of the recess 3, the catalyst layer 5 is also formed only on the tungsten layer W formed on the bottom surface 3a of the recess 3, but is not formed on the surface 3b of the insulating layer of the recess 3.

That is, in the catalyst layer forming unit 12, the catalyst layer 5 is formed only on the surface of the tungsten layer W which is formed on the bottom surface 3a of the recess 3.

The substrate 2 having the catalyst layer 5 formed on the surface of the tungsten layer W is then sent into the catalyst layer baking unit 13. In the catalyst layer baking unit 13, the substrate 2 is heated. Accordingly, the catalyst layer 5 on the surface of the tungsten layer W which is formed on the bottom surface 3a of the recess 3 is baked and hardened.

In case that the catalyst layer 5 is made of the metal nanoparticles, it is possible to harden the catalyst layer 5 more effectively by baking the catalyst layer 5.

Subsequently, the substrate 2 is transferred from the catalyst layer backing unit 13 into the metal wiring layer forming unit 14. In the metal wiring layer forming unit 14, the plating process is performed by supplying, for example, the electroless NiB plating liquid into the recess 3 of the substrate 2, so that the metal wiring layer 7 made of the electroless NiB plating layer is formed on the catalyst layer 5 on the tungsten layer W.

In the second exemplary embodiment, the metal wiring layer 7 formed on the catalyst layer 5 may be made of, by way of non-limiting example, Ni, NiB, NiP, Co, CoB, CoP, or the like.

According to the second exemplary embodiment as described above, the catalyst layer 5 is formed only on the surface of the tungsten layer W which is formed on the bottom surface 3a of the recess 3 of the substrate 2, and catalyst layer 5 is not formed on the surface 3b of the insulating layer of the recess 3. Thus, the metal wiring layer 7 can be formed only at the inside of the recess 3. That is, since the metal wiring layer 7 is not formed at the outside of the recess 3, the chemical mechanical polishing process of removing the metal wiring layer 7 formed at the outside of the recess 3 need not be performed.

EXPLANATION OF CODES

2: Substrate
3: Recess
3a: Bottom surface
3b: Side surface
5: Catalyst layer
7: Metal wiring layer
10: Metal wiring layer forming apparatus
11: Oxide film removing unit
12: Catalyst layer forming unit
13: Catalyst layer baking unit
14: Metal wiring layer forming unit
16: Silylating agent supplying unit
17: Adhesion layer forming unit
20: Controller
21: Recording medium
W: Tungsten layer

We claim:

1. A metal wiring layer forming method of forming a metal wiring layer on a substrate, comprising:
preparing a substrate, having a recess including an insulating layer, in which a tungsten layer is formed on a bottom surface of the recess;
forming a catalyst layer on the tungsten layer on the bottom surface of the recess without forming the catalyst layer on a surface of the insulating layer of the recess; and
forming a metal wiring layer on the catalyst layer within the recess by a plating process.

2. The metal wiring layer forming method of claim 1, wherein before the forming of the catalyst layer on the tungsten layer on the bottom surface of the recess, an oxide film on a surface of the tungsten layer is removed without forming an adhesion layer on the bottom surface of the recess and on the surface of the insulating layer of the recess.

3. The metal wiring layer forming method of claim 1, wherein after the forming of the catalyst layer on the tungsten layer on the bottom surface of the recess, the catalyst layer is hardened by being baked.

4. The metal wiring layer forming method of claim 1, wherein the catalyst layer is formed of a palladium-based catalyst layer, and the metal wiring layer is formed of a Ni-based metal wiring layer.

5. A metal wiring layer forming method of forming a metal wiring layer on a substrate, comprising:
preparing a substrate, having a recess including an insulating layer, in which a tungsten layer is formed on a bottom surface of the recess;
creating, by supplying a silylating agent into the recess, a state in which a coupling agent is attached to the tungsten layer on the bottom surface of the recess without being attached to a surface of the insulating layer of the recess;
forming, by supplying the coupling agent into the recess, an adhesion layer on the tungsten layer on the bottom surface of the recess without forming the adhesion layer on the surface of the insulating layer of the recess;
forming a catalyst layer on the tungsten layer on the bottom surface of the recess without forming the catalyst layer on the surface of the insulating layer of the recess; and
forming a metal wiring layer on the catalyst layer within the recess by a plating process.

6. The metal wiring layer forming method of claim 5, wherein an oxide film on a surface of the tungsten layer is removed before the supplying of the silylating agent into the recess of the substrate.

7. The metal wiring layer forming method of claim 5, wherein after the forming of the catalyst layer on the tungsten layer on the bottom surface of the recess, the catalyst layer is hardened by being baked.

8. The metal wiring layer forming method of claim 5, wherein the catalyst layer is formed of a palladium-based catalyst layer, and the metal wiring layer is formed of a Ni-based metal wiring layer.

9. A metal wiring layer forming apparatus of forming a metal wiring layer on a substrate, comprising:
a catalyst layer forming unit configured to form, with respect to a substrate, having a recess including an insulating layer, in which a tungsten layer is formed on a bottom surface of the recess, a catalyst layer on the tungsten layer on the bottom surface of the recess of the substrate, without forming the catalyst layer on a surface of the insulating layer of the recess; and
a metal wiring layer forming unit configured to form a metal wiring layer on the catalyst layer within the recess by a plating process.

10. The metal wiring layer forming apparatus of claim 9, wherein an oxide film removing unit configured to remove an oxide film on a surface of the tungsten layer is provided at the front of the catalyst layer forming unit.

11. The metal wiring layer forming apparatus of claim 9, wherein a catalyst layer baking unit configured to bake and harden the catalyst layer is provided between the catalyst layer forming unit and the metal wiring layer forming unit.

12. A metal wiring layer forming apparatus of forming a metal wiring layer on a substrate, comprising:
a silylating agent supplying unit configured to create, with respect to the a substrate, having a recess including a side surface and a bottom surface, in which a tungsten layer is formed on the bottom surface of the recess, a state in which a coupling agent is attached to the tungsten layer at the bottom surface of the recess without being attached to the side surface of the recess, by supplying a silylating agent into the recess;
an adhesion layer forming unit configured to form, by supplying the coupling agent into the recess, an adhesion layer on the tungsten layer on the bottom surface of the recess without forming the adhesion layer on the side surface of the recess;
a catalyst layer forming unit configured to form a catalyst layer on the tungsten layer on the bottom surface of the recess without forming the catalyst layer on the side surface of the recess; and
a metal wiring layer forming unit configured to form a metal wiring layer on the catalyst layer within the recess by a plating process.

13. The metal wiring layer forming apparatus of claim 12, wherein an oxide film removing unit configured to remove an oxide film on a surface of the tungsten layer is provided at the front of the silylating agent supplying unit.

14. The metal wiring layer forming apparatus of claim 12, wherein a catalyst layer baking unit configured to bake and harden the catalyst layer is provided between the catalyst layer forming unit and the metal wiring layer forming unit.

15. A non-transitory computer-readable recording medium having stored thereon computer-executable instructions that, in response to execution, cause one or more processors to perform a metal wiring layer forming method, wherein the metal wiring layer forming method comprises:
preparing a substrate, having a recess including a side surface and a bottom surface, in which a tungsten layer is formed on the bottom surface of the recess;
forming a catalyst layer on the tungsten layer on the bottom surface of the recess without forming the catalyst layer on the side surface of the recess; and
forming a metal wiring layer on the catalyst layer within the recess by a plating process.

16. A computer-readable recording medium having stored thereon computer-executable instructions that, in response to execution, cause one or more processors to perform a metal wiring layer forming method, wherein the metal wiring layer forming method comprises:
preparing a substrate, having a recess including a side surface and a bottom surface, in which a tungsten layer is formed on the bottom surface of the recess;
creating, by supplying a silylating agent into the recess, a state in which a coupling agent is attached to the tungsten layer on the bottom surface of the recess without being attached to the side surface of the recess;
forming, by supplying a coupling agent into the recess, an adhesion layer on the tungsten layer on the bottom surface of the recess without forming the adhesion layer on the side surface of the recess;

forming a catalyst layer on the tungsten layer on the bottom surface of the recess without forming the catalyst layer on the side surface of the recess; and forming a metal wiring layer on the catalyst layer within the recess by a plating process.

* * * * *